(12) United States Patent
Matsubara et al.

(10) Patent No.: US 6,917,110 B2
(45) Date of Patent: Jul. 12, 2005

(54) SEMICONDUCTOR DEVICE COMPRISING AN INTERCONNECT STRUCTURE WITH A MODIFIED LOW DIELECTRIC INSULATION LAYER

(75) Inventors: Naoteru Matsubara, Gifu (JP); Hideki Mizuhara, Bisai (JP); Takashi Goto, Ushiku (JP)

(73) Assignee: Sanyo Electric Co., Ltd., Osaka (JP)

( * ) Notice: Subject to any disclaimer, the term of this patent is extended or adjusted under 35 U.S.C. 154(b) by 30 days.

(21) Appl. No.: 10/310,138

(22) Filed: Dec. 5, 2002

(65) Prior Publication Data

US 2003/0116853 A1 Jun. 26, 2003

(30) Foreign Application Priority Data

Dec. 7, 2001 (JP) .......................... 2001-373972

(51) Int. Cl.[7] ............................. H01L 23/522
(52) U.S. Cl. ................. 257/759; 257/635; 257/650; 257/774
(58) Field of Search .................... 257/382–385, 257/750–772, 774, 777–784, 635, 650

(56) References Cited

U.S. PATENT DOCUMENTS

| 3,747,203 | A | 7/1973 | Shannon |
| 4,668,973 | A | 5/1987 | Dawson et al. |
| 4,676,867 | A | 6/1987 | Elkins et al. |
| 4,775,550 | A | 10/1988 | Chu et al. |
| 4,885,262 | A | 12/1989 | Ting et al. |
| 4,920,071 | A | 4/1990 | Thomas |
| 4,962,052 | A | 10/1990 | Asayama et al. |
| 4,983,546 | A | 1/1991 | Hyun et al. |
| 4,984,055 | A | 1/1991 | Okumura et al. |
| 5,003,062 | A | 3/1991 | Yen |
| 5,024,723 | A | 6/1991 | Goesele et al. |
| 5,084,412 | A | 1/1992 | Nakasaki |
| 5,087,589 | A | 2/1992 | Chapman et al. |
| 5,108,787 | A | 4/1992 | Hiraki et al. |

(Continued)

FOREIGN PATENT DOCUMENTS

| DE | 42 18 495 A1 | 12/1992 |
| EP | 0 602 607 A1 | 6/1994 |

(Continued)

OTHER PUBLICATIONS

Wolf, S.; Silicon Processing for the VLSI Era; vol. 2, Lattice Press; pp. 232–233.

(Continued)

*Primary Examiner*—Wael Fahmy
*Assistant Examiner*—Marcos D. Pizzaro-Crespo
(74) *Attorney, Agent, or Firm*—McDermott Will & Emery LLP

(57) ABSTRACT

A semiconductor device capable of inhibiting a conductive plug from increase of resistance or disconnection resulting from moisture discharged from a first insulator film while reducing the capacitance between adjacent first interconnection layers is obtained. This semiconductor device comprises a plurality of first interconnection layers formed on a semiconductor substrate at a prescribed interval, a first insulator film, formed to fill up the clearance between the plurality of first interconnection layers, having an opening reaching the first interconnection layers and a conductive plug charged in the opening of the first insulator film and formed to be in contact with the first interconnection layers. An impurity is selectively introduced into a first region of the first insulator film in the vicinity of contact surfaces between the first interconnection layers and the conductive plug, thereby selectively modifying the first region of the first insulator film.

9 Claims, 8 Drawing Sheets

U.S. PATENT DOCUMENTS

| | | | |
|---|---|---|---|
| 5,153,680 A | 10/1992 | Naito et al. | |
| 5,166,768 A | 11/1992 | Ito | |
| 5,186,745 A | 2/1993 | Maniar | |
| 5,192,697 A | 3/1993 | Leong | |
| 5,270,259 A | 12/1993 | Ito et al. | |
| 5,310,700 A | 5/1994 | Lien et al. | |
| 5,314,843 A | 5/1994 | Yu et al. | |
| 5,321,211 A | * 6/1994 | Haslam et al. | 174/262 |
| 5,341,026 A | 8/1994 | Harada et al. | |
| 5,352,630 A | 10/1994 | Kim et al. | |
| 5,373,192 A | 12/1994 | Eguchi | |
| 5,387,812 A | 2/1995 | Forouhi et al. | |
| 5,404,046 A | 4/1995 | Matsumoto et al. | |
| 5,429,990 A | 7/1995 | Liu et al. | |
| 5,459,086 A | 10/1995 | Yang | |
| 5,468,684 A | 11/1995 | Yoshimori et al. | |
| 5,479,054 A | 12/1995 | Tottori | |
| 5,496,776 A | 3/1996 | Chien et al. | |
| 5,514,910 A | 5/1996 | Koyama | |
| 5,519,254 A | 5/1996 | Tabara | |
| 5,523,616 A | 6/1996 | Den | |
| 5,541,445 A | 7/1996 | Quellet | |
| 5,549,786 A | 8/1996 | Jones et al. | |
| 5,569,618 A | 10/1996 | Matsubara | |
| 5,581,101 A | 12/1996 | Ning et al. | |
| 5,607,880 A | 3/1997 | Suzuki et al. | |
| 5,616,513 A | 4/1997 | Shepard | |
| 5,665,845 A | 9/1997 | Allman | |
| 5,674,784 A | 10/1997 | Jang et al. | |
| 5,702,568 A | 12/1997 | Shin et al. | |
| 5,723,895 A | 3/1998 | Takahashi | |
| 5,753,975 A | 5/1998 | Matsuno | |
| 5,786,273 A | 7/1998 | Hibi et al. | |
| 5,817,582 A | 10/1998 | Maniar | |
| 5,818,068 A | 10/1998 | Sasaki et al. | |
| 5,830,773 A | 11/1998 | Brennan et al. | |
| 5,855,962 A | 1/1999 | Cote et al. | |
| 5,866,476 A | 2/1999 | Choi et al. | |
| 5,892,269 A | 4/1999 | Inoue et al. | |
| 5,898,221 A | 4/1999 | Mizuhara et al. | |
| 5,930,624 A | 7/1999 | Murata et al. | |
| 5,963,827 A | 10/1999 | Enomoto et al. | |
| 6,001,745 A | 12/1999 | Tu et al. | |
| 6,013,578 A | 1/2000 | Jun | |
| 6,071,807 A | 6/2000 | Watanabe et al. | |

FOREIGN PATENT DOCUMENTS

| | | | |
|---|---|---|---|
| JP | 56-125844 | 10/1981 | |
| JP | 58-31519 | 2/1983 | |
| JP | 59-17243 | 1/1984 | |
| JP | 62-60242 | 3/1987 | |
| JP | 63-198359 | 8/1988 | |
| JP | 1-199456 | 8/1989 | |
| JP | 1-307247 | 12/1989 | |
| JP | 1-319942 | 12/1989 | |
| JP | 2-7451 | 1/1990 | |
| JP | 2-26055 | 1/1990 | |
| JP | 2-101532 | 4/1990 | |
| JP | 2-235358 | 9/1990 | |
| JP | 2-253643 | 10/1990 | |
| JP | 3-101130 | 4/1991 | |
| JP | 4-234149 | 8/1992 | |
| JP | 4-307934 | 10/1992 | |
| JP | 4-317358 | 11/1992 | |
| JP | 5-74963 | 3/1993 | |
| JP | 5-198523 | 8/1993 | |
| JP | 5-226334 | 9/1993 | |
| JP | 8-218284 | 8/1994 | |
| JP | 6-275229 | 9/1994 | |
| JP | 6-291202 | 10/1994 | |
| JP | 6-349950 | 12/1994 | |
| JP | 7-99195 | 4/1995 | |
| JP | 8-17770 | 1/1996 | |
| JP | 8-64561 | 3/1996 | |
| JP | 8-241891 | 9/1996 | |
| JP | 9-69562 | 3/1997 | |
| JP | 9-246375 | 9/1997 | |
| JP | 9-312339 | 12/1997 | |
| JP | 9-330982 | 12/1997 | |
| JP | 10-209147 | 8/1998 | |
| JP | 10-270447 | 10/1998 | |
| JP | 10270447 A | * 10/1998 | ....... H01L/21/3205 |
| JP | 10-303295 | 11/1998 | |
| JP | 11-162967 | 6/1999 | |
| KR | 0179563 | 11/1998 | |

OTHER PUBLICATIONS

"Multilevel–Interconnect Technology for VLSI and ULSI" Stanley Wolf, Ph.D. *Silicon Processing for the VLSI ERA* vol. 2 –Process Integration (1990) pp. 201–204, 226–228, 232–233.

"Lithography I: Optical Resist Materials and Process Technology" *Silicon Processing for the VLSI ERA* vol. 1 –Process Technology (1986) p. 441.

"1995 Proceedings Twelfth International VLSI Multilevel Interconnection Conference (VMIC)" Library of Congress No. 89–644090 (Jun. 27–29, 1995) Santa Clara, CA, pp. 457–463.

"Si–SiO$_2$ MOS Diode" S.M. Sze *Physics of Semiconductor Device* 2nd ed.(1981) p. 393.

"A Study of Plasma Treatments on Siloxane SOG" C.K. Wang, et al. *IEEE VMIC Conference* (Jun. 7–8, 1994) pp. 101–107.

"Defects Study on Spin on Glass Planarization Technology" C. Chiang, et al. *IEEE VMIC Conference* (Jun. 15–16, 1987) pp. 404–412.

"Fluorine–Implanted Treatment (FIT) SOG for the Non–Etchback Intermetal Dielectric" Lai–Juh Chen, et al. *IEEE VMIC Conference* (Jun. 7–8, 1994) pp. 81–86.

"Modification Effects in Ion–Implanted SiO$_2$ Spin–on–Glass" N. Moriya et al. *J. Electrochem Soc.* vol. 140, No. 5 (May 1993) pp. 1442–1450.

"An Advanced Interlayer Dielectric System with Partially Converted Organic SOG by Using Plasma Treatment" M. Matsuura et al. *IEEE VMIC Conference* (Jun. 8–9, 1993) pp. 113–115.

"Mechanism for AlSiCu Alloy Corrosion" Tomoaki Ishida et al., *Jpn. J. Appl. Phys.* vol. 31 Part 1 No. 6B (Jun. 1992) pp. 2045–2048.

"Moisture–Blocking Mechanism of ECR–Plasma SiO$_2$ and High Reliable Performance of Multilevel–Al–Metalization" M. Doki et al., *IEEE VMIC Conference* (Jun. 7–8, 1994) pp. 235–239.

"Dielectric Constant of Silicon Dioxide Deposited by Atmospheric–Pressure Chemical Vapor Deposition Using Tetraethylorthosilicate and Ozone" Katsumi Murase, *Jpn. J. Appl. Phys.* vol. 33 Part 1 No. 3A (Mar. 1994) pp. 1385–1389.

"Suppression of MOSFET Hot Carrier Degradation by P–SiO Underlayer" Kimiaki Shimokawa et al., Technical Report of IEICE SDM92–133 (Dec., 1992) pp. 89 (English abstract) pp. 90–94 (Japanese).

* cited by examiner

US 6,917,110 B2

SEMICONDUCTOR DEVICE COMPRISING AN INTERCONNECT STRUCTURE WITH A MODIFIED LOW DIELECTRIC INSULATION LAYER

BACKGROUND OF THE INVENTION

1. Field of the Invention

The present invention relates to a semiconductor device and a method of fabricating the same, and more particularly, it relates to a semiconductor device including a plurality of interconnection layers and a method of fabricating the same.

2. Description of the Background Art

Following the recently progressed refinement of a semiconductor device, electric resistance has been remarkably increased due to reduction of an interconnection width and the capacitance between adjacent interconnections has been also remarkably increased due to reduction of an interconnection pitch, leading to large interconnection delay. Therefore, it is important to reduce such interconnection delay in the semiconductor device, in order to operate the semiconductor device at a high speed. A delay time resulting from the interconnection delay depends on resistive and capacitive components of the interconnections. In order to reduce the interconnection delay, therefore, it is effective to employ copper (Cu) or the like as the material for the interconnections while employing a material having a low dielectric constant for an insulator film insulating the interconnections from each other thereby reducing the capacitance between the interconnections.

In general, an organic SOG (spin on glass) film, for example, is known as the material having a low dielectric constant employed for the insulator film insulating the interconnections from each other. This organic SOG film is an insulator film mainly composed of silicon dioxide obtained by polymerizing a monomer of a silicon compound containing an organic functional group. When the organic SOG film having a low dielectric constant is employed as the insulator film insulating interconnection layers from each other, the capacitance between the interconnection layers is so reduced as to reduce the interconnection delay.

FIGS. 10 to 12 are sectional views for illustrating a method of fabricating a conventional semiconductor device employing an organic SOG film as an insulator film between interconnection layers. In the method of fabricating the conventional semiconductor device, a plurality of lower interconnections 102 are first formed on an interlayer dielectric film 101 formed on a semiconductor substrate 100 at prescribed intervals, as shown in FIG. 10. A silicon oxide film 103 is formed to cover the interlayer dielectric film 101 and the lower interconnections 102. Thereafter an organic SOG film 104 having a smoothly flattened upper surface is formed on the upper surface of the silicon oxide film 103 by a method of application to fill up the clearances between the lower interconnections 102.

As shown in FIG. 11, a silicon oxide film 106 is deposited on the organic SOG film 104 and the upper surface thereof is polished by CMP (chemical mechanical polishing) to be flattened.

As shown in FIG. 12, contact holes 108 reaching the upper surfaces of some of the lower interconnections 102 are formed through the organic SOG film 104 and the silicon oxide film 106 by ordinary photolithography and anisotropic etching. Metal materials of tungsten (W), copper (Cu) or aluminum (Al) are embedded in the contact holes 108 and the surfaces of the metal materials are flattened by CMP or an etch-back method, thereby forming plugs 109.

In the structure of the conventional semiconductor device shown in FIG. 12, the organic SOG film 104 having a low dielectric constant fills up the clearances between the lower interconnections 102, thereby reducing the capacitance between the adjacent lower interconnections 102.

However, the organic SOG film 104 having low density basically easily absorbs moisture. Further, the organic SOG film 104 has low resistance against plasma. When a resist film (not shown) employed as a mask for forming the contact holes 108 is removed by ashing employing plasma etching, therefore, the organic component forming the organic SOG film 104 is disadvantageously desorbed from the surface portions of the organic SOG film 104 exposed in the contact holes 108. When the organic component is desorbed, the exposed surfaces of the organic SOG film 104 absorb moisture. When the plugs 109 connected to the lower interconnections 102 are formed in the contact holes 108, voids are formed in the plugs 109 by the so-called poisoned via phenomenon due to the moisture discharged from the exposed portions of the organic SOG film 104. The voids formed in the plugs 109 due to the poisoned via phenomenon disadvantageously increase the resistance values of the plugs 109 or cause disconnection.

In order to eliminate the aforementioned inconvenience, there has generally been proposed a technique of implanting ions into an organic SOG film thereby decomposing an organic component contained in the organic SOG film and increasing the density of the organic SOG film, as disclosed in Japanese Patent No. 3015717, Japanese Patent No. 2975934 or Japanese Patent Laying-Open No. 9-312339 (1998), for example. When the organic component is decomposed for increasing the density of the organic SOG film, the organic SOG film is modified.

FIGS. 13 to 16 are sectional views for illustrating a process of fabricating a conventional semiconductor device employing a modified organic SOG film as an insulator film between interconnection layers. In the process of fabricating the conventional semiconductor device, a plurality of lower interconnections 112 are formed on an interlayer dielectric film 111 formed on a semiconductor substrate 110 at prescribed intervals, as shown in FIG. 13. A silicon oxide film 113 is formed to cover the lower interconnections 112 and the interlayer dielectric film 111. An organic SOG film 114 having a flattened upper surface is formed on the silicon oxide film 113 by a method of application to fill up the clearances between the adjacent lower interconnections 112. Thereafter an impurity is ion-implanted into the organic SOG film 114 thereby forming a modified organic SOG film (modified SOG film) 115, as shown in FIG. 14. The density of the modified SOG film 115 is increased by decomposing the organic component through the ion implantation of the impurity.

As shown in FIG. 15, a silicon oxide film 116 is formed on the modified SOG film 115 and the upper surface thereof is thereafter polished by CMP, to be flattened. As shown in FIG. 16, contact holes 118 reaching the upper surfaces of some of the lower interconnections 112 are formed through the silicon oxide film 116 and the modified SOG film 115 by ordinary photolithography and anisotropic etching. Metal materials of W, Cu or Al are embedded in the contact holes 118 and the surfaces thereof are flattened by CMP or an etch-back method, thereby forming plugs 119.

In the structure of the conventional semiconductor device shown in FIG. 16, the modified SOG film 115 increased in density by modifying the organic SOG film 114 is so employed that portions of the modified SOG film 115 hardly absorbing moisture are exposed in the contact holes 118 and inhibited from discharging moisture in formation of the plugs 19. Thus, the plugs 119 can be inhibited from increase of resistance or disconnection in the contact holes 118.

When the modified SOG film 115 is formed by modifying the organic SOG film 114 by ion implantation or the like, however, the dielectric constant intrinsically provided in the organic SOG film 114 is disadvantageously increased. When the modified SOG film 115 is employed as the insulator film between the adjacent lower interconnections 112, the effect of reducing the capacitance between the interconnections is disadvantageously reduced as compared with the case of employing the organic SOG film 104 shown in FIG. 12 as the insulator film between the adjacent lower interconnection 102. Consequently, the effect of reducing interconnection delay is disadvantageously reduced.

SUMMARY OF THE INVENTION

An object of the present invention is to provide a semiconductor device capable of inhibiting a conductive plug from increase of resistance or disconnection resulting from moisture discharged from an insulator film while reducing the capacitance between adjacent interconnection layers.

Another object of the present invention is to provide a method of fabricating a semiconductor device capable of inhibiting a conductive plug from increase of resistance or disconnection resulting from moisture discharged from an insulator film while reducing the capacitance between adjacent interconnection layers.

A semiconductor device according to a first aspect of the present invention comprises a plurality of first interconnection layers formed on a semiconductor substrate at a prescribed interval, a first insulator film, formed to fill up the clearance between the plurality of first interconnection layers, having an opening reaching the first interconnection layers, and an conductive plug charged in the opening of the first insulator film and formed to be in contact with the first interconnection layers. An impurity is selectively introduced into a first region of the first insulator film in the vicinity of contact surfaces between the first interconnection layers and the conductive plug thereby selectively modifying the first region of the first insulator film.

In the semiconductor device according to the first aspect, as hereinabove described, the impurity is selectively introduced into the first region of the first insulator film in the vicinity of the contact surfaces between the first interconnection layers and the conductive plug for selectively modifying the first region of the first insulator film so that the modified first region of the first insulator film can inhibit the conductive plug from increase of resistance or disconnection resulting from moisture discharged from the first insulator film while reducing the capacitance between the adjacent first interconnection layers by a portion of the first insulator film having a small dielectric constant when the first insulator film is prepared from a material having a small dielectric constant.

In the aforementioned semiconductor device according to the first aspect, the conductive plug is preferably formed to be in contact with the upper surfaces of the first interconnection layers, the first insulator film preferably includes the first region modified in the vicinity of the contact surfaces between the first interconnection layers and the conductive plug and an unmodified second region other than the first region, and the boundary between the first region and the second region of the first insulator film is preferably located downward beyond the upper surfaces of the first interconnection layers. According to this structure, the conductive plug can be reliably inhibited from increase of resistance or disconnection resulting from moisture discharged from the first insulator film.

In the aforementioned semiconductor device according to the first aspect, the first insulator film may be formed to be directly in contact with the first interconnection layers. According to this structure, the capacitance between the adjacent first interconnection layers can be more reduced as compared with a case of interposing another insulator film having a larger dielectric constant than the first insulator film between the first interconnection layers and the first insulator film.

The aforementioned semiconductor device according to the first aspect may further comprise a second insulator film, interposed between the first insulator film and the first interconnection layers, superior to the first insulator film in adhesiveness. According to this structure, the second insulator film can improve the adhesiveness between the first insulator film and the first interconnection layers.

In the aforementioned semiconductor device according to the first aspect, the impurity selectively introduced into the first insulator film is preferably boron. According to this structure, boron widely employed as the impurity introduced into an insulator film can be easily and controllably introduced into the first insulator film.

In the aforementioned semiconductor device according to the first aspect, the first insulator film preferably includes an organic SOG film. According to this structure, a first insulator film having a small dielectric constant can be obtained.

In the aforementioned semiconductor device according to the first aspect, the upper surface of the first insulator film may be substantially flattened. Further, the first interconnection layers may be formed to be in contact with the upper surface of an interlayer dielectric film formed on the semiconductor substrate. The aforementioned semiconductor device according to the first aspect may further comprise a second interconnection layer formed to be in contact with the upper surface of the conductive plug.

In the aforementioned semiconductor device according to the first aspect, the opening of the first insulator film is preferably formed to expose the upper surfaces and the side surfaces of the first interconnection layers as well as a region of the first insulator film located under the modified first region, and a modified region is preferably formed on the region of the first insulator film located under the first region exposed in the opening. According to this structure, the conductive plug can be inhibited from increase of resistance or disconnection resulting from moisture discharged from the first insulator film also when a region of the first insulator film other than the modified first region is exposed in the opening due to misregistration of the opening with respect to the first interconnection layers.

A method of fabricating a semiconductor device according to a second aspect of the present invention comprises steps of forming a plurality of first interconnection layers on a semiconductor substrate at a prescribed interval, forming a first insulator film by a method of application to fill up the clearance between the plurality of first interconnection layers, forming an opening reaching the first interconnection layers in the first insulator film, forming a conductive plug to be charged in the opening of the first insulator film and in contact with the first interconnection layers and selectively introducing an impurity into a first region of the first insulator film located in the vicinity of contact surfaces between the first interconnection layers and the conductive plug after forming the first insulator film and before forming the conductive plug thereby selectively modifying the first region of the first insulator film.

The method of fabricating a semiconductor device according to the second aspect selectively introduces the impurity into the first region of the first insulator film located in the vicinity of the contact surfaces between the first interconnection layers and the conductive plug thereby selectively modifying the first region of the first insulator film as hereinabove described, whereby the modified first region of the first insulator film can inhibit the conductive plug from increase of resistance or disconnection resulting from moisture discharged from the first insulator film while reducing the capacitance between the adjacent first interconnection layers by a portion of the first insulator film having a small dielectric constant when the first insulator film is made of a material having a small dielectric constant.

In the aforementioned method of fabricating a semiconductor device according to the second aspect, the first insulator film preferably includes the modified first region located in the vicinity of the contact surfaces between the first interconnection layers and the conductive plug and an unmodified second region other than the first region, and the step of selectively modifying the first region of the first insulator film preferably includes a step of selectively introducing the impurity into the first region of the first insulator film located in the vicinity of the contact surfaces between the first interconnection layers and the conductive plug so that the boundary between the first region and the second region of the first insulator film is located downward beyond the upper surfaces of the first interconnection layers. According to this structure, the conductive plug can be reliably inhibited from increase of resistance or disconnection resulting from moisture discharged from the first insulator film.

In the aforementioned method of fabricating a semiconductor device according to the second aspect, the step of forming the first insulator film preferably includes a step of forming the first insulator film to be directly in contact with the first interconnection layers. According to this structure, the capacitance between the adjacent first interconnection layers can be more reduced as compared with a case of interposing another insulator film having a larger dielectric constant than the first insulator film between the first interconnection layers and the first insulator film.

In the aforementioned method of fabricating a semiconductor device according to the second aspect, the step of forming the first insulator film preferably includes a step of forming the first insulator film while interposing a second insulator film superior to the first insulator film in adhesiveness between the first insulator film and the first interconnection layers. According to this structure, the second insulator film can improve the adhesiveness between the first insulator film and the first interconnection layers.

In the aforementioned method of fabricating a semiconductor device according to the second aspect, the step of selectively modifying the first region of the first insulator film preferably includes a step of selectively modifying the first region of the first insulator film by selectively ion-implanting the impurity into the first insulator film. When ion implantation is employed, the impurity can be easily selectively introduced into the first insulator film. In this case, the impurity selectively ion-implanted into the first insulator film is preferably boron. According to this structure, boron widely employed as the impurity introduced into an insulator film can be easily and controllably introduced into the first insulator film.

In the aforementioned method of fabricating a semiconductor device according to the second aspect, the first insulator film preferably includes an organic SOG film. According to this structure, a first insulator film having a small dielectric constant can be obtained.

In the aforementioned method of fabricating a semiconductor device according to the second aspect, the step of forming the first insulator film may include a step of forming the first insulator film so that the upper surface of the first insulator film is substantially flat. Further, the step of forming the first interconnection layers may include a step of forming the first interconnection layers to be in contact with the upper surface of an interlayer dielectric film formed on the semiconductor substrate. In addition, the method of fabricating a semiconductor device may further comprise a step of forming a second interconnection layer to be in contact with the upper surface of the conductive plug.

In the aforementioned method of fabricating a semiconductor device according to the second aspect, the step of forming the opening reaching the first interconnection layers in the first insulator film preferably includes steps of etching the first insulator film through a resist mask thereby forming the opening reaching the first interconnection layers and applying a low-pressure plasma for modifying the property of an exposed surface of the first insulator film located in the opening in advance of application of a high-pressure plasma for completely removing the resist mask when removing the resist mask by ashing. When an unmodified region of the first insulator film is exposed in the opening due to misregistration of the opening with respect to the first interconnection layers, the exposed unmodified region is modified according to this structure. Thus, the conductive plug can be inhibited from increase of resistance or disconnection resulting from moisture discharged from the first insulator film also when the opening is misregistered with respect to the first interconnection layers.

In this case, the step of applying the low-pressure plasma preferably includes a step of applying the low-pressure plasma with an oxygen plasma at a pressure of not more than 2 Pa. When an unmodified region of the first insulator film is exposed in the opening due to misregistration of the opening with respect to the first interconnection layers, an exposed portion of the unmodified second region can be reliably modified according to this structure.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
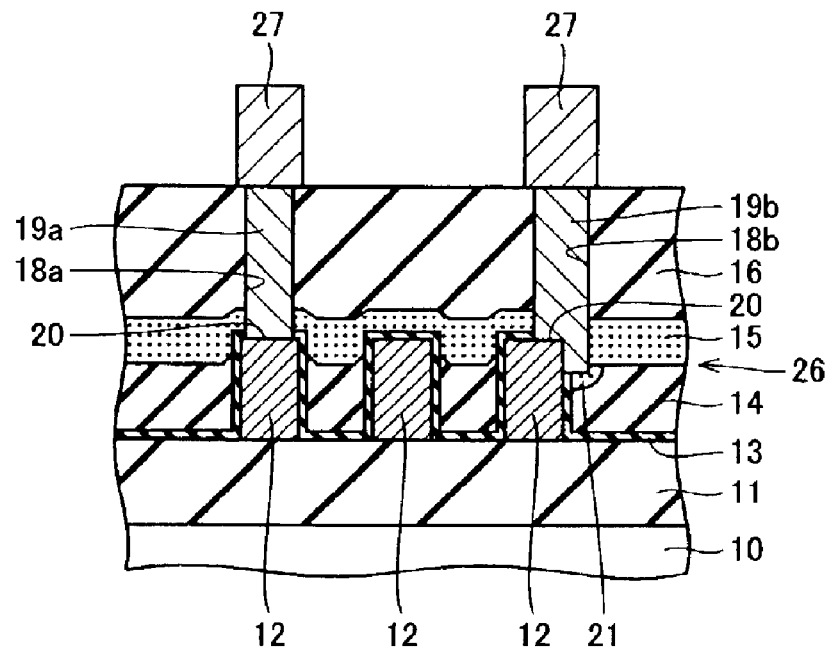
FIG. 1 is a sectional view showing a semiconductor device according to a first embodiment of the present invention.

Embodiments of the present invention are now described with reference to the drawings.

(First Embodiment)

The structure of a semiconductor device according to a first embodiment of the present invention is now described with reference to FIG. 1. In the semiconductor device according to the first embodiment, a plurality of lower interconnections 12 are formed on an interlayer dielectric film 11 formed on a semiconductor substrate 10 at prescribed intervals. The lower interconnections 12 are examples of the "first interconnection layers" in the present invention. The lower interconnections 12 are formed to have a thickness of about 540 nm. The density (open area ratio of the interlayer dielectric film 11) of the interconnection areas of the plurality of lower interconnections 12 is about 50%. A silicon oxide film 13 having a thickness of about 50 nm is formed on the side surfaces and the upper surfaces of the lower interconnections 12 as well as the upper surface of the interlayer dielectric film 11. The silicon oxide film 13 is an example of the "second insulator film" in the present invention. The silicon oxide film 13 is so formed as to improve adhesiveness of an organic SOG film 14 described later to the interlayer dielectric film 11 and the lower interconnections 12. In other words, the silicon oxide film 13 is superior to the organic SOG film 14 in adhesiveness with respect to the interlayer dielectric film 11 and the lower interconnections 12.

The organic SOG film 14 and a modified SOG film 15 are formed on the silicon oxide film 13. The organic SOG film 14 is an example of the "first insulator film" and the "second region" in the present invention, and the modified SOG film 15 is an example of the "modified first insulator film" and the "first region" in the present invention. The organic SOG film 14 is formed with a thickness of about 390 nm to fill up the clearances between the lower interconnections 12. The modified SOG film 15 is formed on the organic SOG film 14 with a thickness of about 300 nm. The modified SOG film 15 is formed by implanting boron ions into a portion around the surface of the organic SOG film 14 thereby modifying the characteristics of the organic SOG film 14 in the portion around the surface thereof. The boundary 26 between the organic SOG film 14 and the modified SOG film 15 is arranged to be located downward by about 100 nm beyond the upper surfaces 20 of the lower interconnections 12.

A silicon oxide film 16 having a thickness of about 1000 nm is formed on the modified SOG film 15. Contact holes 18a and 18b reaching the upper surfaces 20 of some of the lower interconnections 12 are formed in the silicon oxide film 16. Plugs 19a and 19b including barrier layers (not shown) of Ti layers and TiN layers and tungsten (W) layers formed through the barrier layers are formed in the contact holes 18a and 18b respectively. Upper interconnections 27 are formed to be in contact with the upper surfaces of the plugs 19a and 19b respectively. The contact holes 18a and 18b are examples of the "opening" in the present invention, and the plugs 19a and 19b are examples of the "conductive plug" in the present invention. The upper interconnections 27 are examples of the "second interconnection layer" in the present invention.

In the structure of the first embodiment shown in FIG. 1, the contact hole 18 is dislocated from a proper position. Therefore, the contact hole 18b exposes the upper surface and a side surface of the lower interconnection 12 located under the same while exposing a region of the organic SOG film 14 located under the modified SOG film 15. According to the first embodiment, a modified SOG region 21 formed by partially treating the organic SOG film 14 with a low-pressure plasma is provided on the region of the bottom of the contact hole 18b partially exposing the organic SOG film 14. The modified SOG region 21 is an example of the "modified region" in the present invention.

In the semiconductor device according to the first embodiment, boron is selectively introduced into a portion of the organic SOG film 14 located in the vicinity of the contact surfaces between the lower interconnections 12 and the plugs 19a and 19b thereby forming the modified SOG film 15 as hereinabove described, whereby the modified SOG film 15 can inhibit the plugs 19a and 19b from increase of resistance or disconnection resulting from moisture discharged from the organic SOG film 14 while the organic SOG film 14 having a small dielectric constant reduces the capacitance between the adjacent lower interconnections 12.

In other words, the boundary 26 between the organic SOG film 14 and the modified SOG film 15 is located downward beyond the upper surfaces 20 of the lower interconnections 12 in contact with the plugs 19a and 19b so that the organic SOG film 14 having a small dielectric constant fills up the clearances between the lower interconnections 12 and the modified SOG film 15 is arranged in the vicinity of the contact surfaces between the lower interconnections 12 and the plugs 19a and 19b. Thus, a poisoned via phenomenon causing voids in the plugs 19a and 19b due to moisture discharged from the organic SOG film 14 can be suppressed while reducing the capacitance between the lower interconnections 12. Consequently, the plugs 19a and 19b can be inhibited from increase of resistance or disconnection resulting from the poisoned via phenomenon while reducing the capacitance between the lower interconnections 12.

In the semiconductor device according to the first embodiment, further, the silicon oxide film 13 having excellent adhesiveness is interposed between the organic SOG film 14 and the interlayer dielectric film 11 and the lower interconnections 12 as hereinabove described, whereby the organic SOG film 14 can be improved in adhesiveness to the interlayer dielectric film 11 and the lower interconnections 12.

In the semiconductor device according to the first embodiment, in addition, the modified SOG region 21 is formed between the lower surface of the plug 19b and the organic SOG film 14 so that the modified SOG region 21 can inhibit the plug 19b from increase of resistance or disconnection resulting from moisture discharged from the organic SOG film 14 also when the opening 18 is dislocated.

A method of fabricating the semiconductor device according to the first embodiment is now described with reference to FIGS. 2 to 7.

Figure 2:
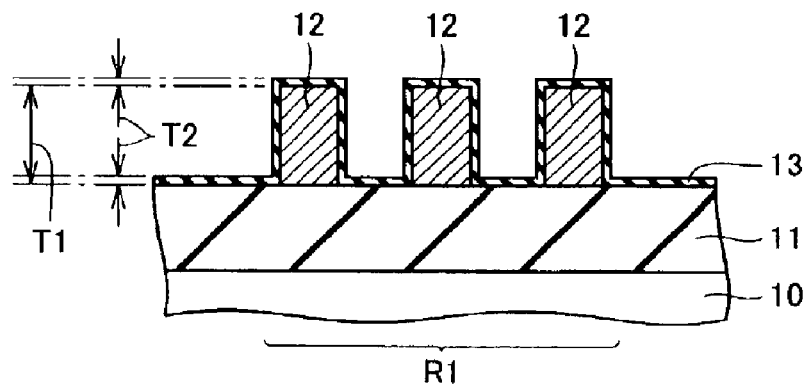
FIGS. 2 to 7 are sectional views showing a process of fabricating the semiconductor device according to the first embodiment shown in FIG. 1.

First, the interlayer dielectric film 11 flattened as an underlayer is formed on the semiconductor substrate 10, as shown in FIG. 2. The plurality of lower interconnections 12 consisting of a metal material such as aluminum (Al) are formed with the thickness of about 540 nm (T1) at the prescribed intervals, to be in contact with the upper surface of the interlayer dielectric film 11. In this case, the lower interconnections 12 are so formed that the open area ratio (density of the interconnection areas) of the interlayer dielectric film 11 in a region R1 formed with the lower interconnections 12 is about 50%. Thereafter the silicon oxide film 13 is formed with the thickness of about 50 nm (T2) by plasma CVD (chemical vapor deposition) to cover the upper surface of the interlayer dielectric film 11 as well as the side surfaces and the upper surfaces of the lower interconnections 12. The plasma CVD for forming the silicon oxide film 13 is carried out with gas prepared from monosilane and nitrous oxide ($SiH_4+N_2O$), monosilane and oxygen ($SiH_4+O_2$) or TEOS (tetraethoxysilane) and oxygen ($TEOS+O_2$). The film forming temperature for the silicon oxide film 13 is about 200° C. to about 500° C.

Figure 3:
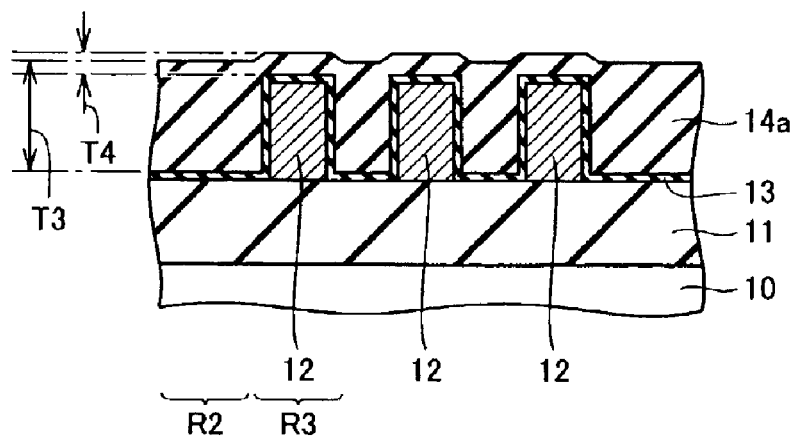

As shown in FIG. 3, an organic SOG film 14a is formed on the upper surface of the silicon oxide film 13 by the method of application with a thickness of about 400 nm. More specifically, an alcoholic solution (e.g., isopropyl alcohol+acetone) of a silicon compound expressed in a chemical formula $CH_3Si(OH)_3$ is dropped on the surface of the semiconductor substrate 10 formed with the silicon oxide film 13 while rotating the semiconductor substrate 10. At this time, the semiconductor substrate 10 is rotated at a rotational speed of about 5000 rpm for about 20 seconds. Thus, a coating of the alcoholic solution is formed on the region R1 provided with the lower interconnections 12 thickly on recess portions and thinly on projection portions, to relax steps. Consequently, the surface of the coating of the alcoholic solution is smoothly flattened.

Thereafter heat treatments are successively performed in a nitrogen atmosphere at a temperature of about 100° C. for about one minute, at a temperature of about 200° C. for one minute, at a temperature of about 250° C. for about one minute, at a temperature of about 22° C. for about one minute and at a temperature of about 400° C. for about 30 minutes respectively. Thus, the aforementioned alcoholic solution is evaporated while polymeric reaction so progresses as to smoothly flatten the surface of the organic SOG film 14a. Under the aforementioned conditions, part of the organic SOG film 14a has a thickness of about 690 nm (T3) on a region R2 formed with no lower interconnection 12. Another part of the organic SOG film 14a has a thickness of about 150 nm (T4) on a region R3 provided with each lower interconnection 12 on the silicon oxide film 13 of about 50 nm in thickness formed on the upper surface of the lower interconnection 12.

Figure 4:
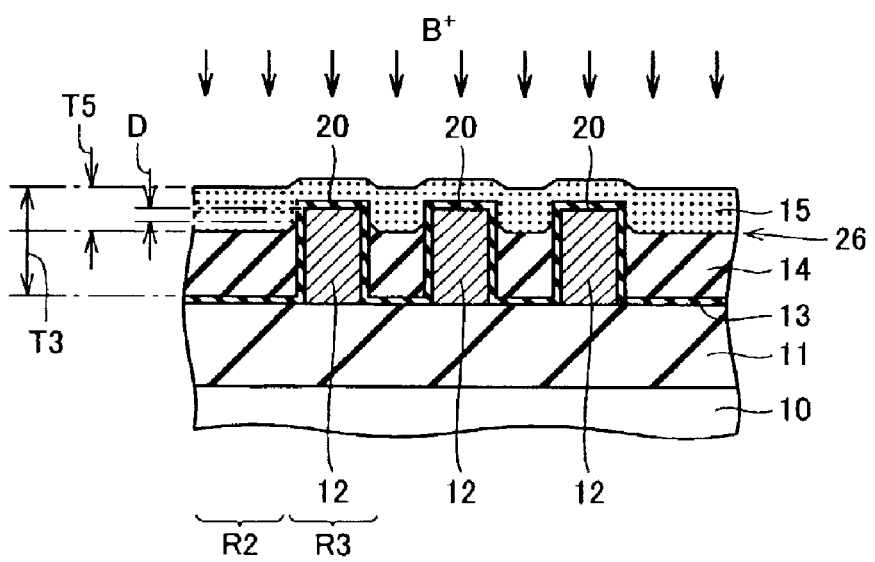

As shown in FIG. 4, boron ions ($B^+$) are implanted into the organic SOG film 14a (see FIG. 3) under conditions of acceleration energy of about 80 keV and a dose of about $2\times10^{15}$ ions/cm². Thus, the part of the organic SOG film 14a subjected to this ion implantation is modified into the highly densified modified SOG film 15 containing no organic component with only a slight quantity of moisture and hydroxyl groups.

The boundary 26, indicating the depth of modification of the organic SOG film 14a, between the modified SOG film 15 and the organic SOG film 14 not subjected to the ion implantation is decided by the acceleration energy for the ion implantation. According to the first embodiment, the ion implantation is carried out under the conditions for locating the boundary 26 downward beyond the upper surfaces 20 of the lower interconnections 12 defining the contact surfaces between the lower interconnections 12 and the plugs 19a and 19b (see FIG. 1), as shown in FIG. 4. Under the aforementioned ion implantation conditions, the organic SOG film 14a is modified up to a depth of about 300 nm (T5) from the upper surface thereof. In the region R3 formed with each lower interconnection 12, therefore, a portion up to a depth (D) of (T5−(T2+T4))=about 100 nm from the upper surface 20 of the lower interconnection 12 is modified into the modified SOG film 15.

Thus, the ion implantation is so carried out as to locate the boundary 26 between the organic SOG film 14 and the modified SOG film 15 downward beyond the upper surfaces 20 of the lower interconnections 12, thereby guaranteeing adjacency between a portion located in the vicinity of the contact surfaces of the properly positioned plug 19a (see FIG. 1) and the lower interconnection 12 located under the same and the modified SOG film 15. Therefore, the organic SOG film 14 can be inhibited from discharging moisture in the portion located in the vicinity of the contact surfaces of the properly positioned plug 19a and the lower interconnection 12 located under the same, thereby suppressing a poisoned via phenomenon causing voids in the plug 19a due to moisture discharged from the organic SOG film 14. Thus, the plug 19a can be inhibited from increase of resistance or disconnection resulting from a poisoned via phenomenon.

Figure 5:
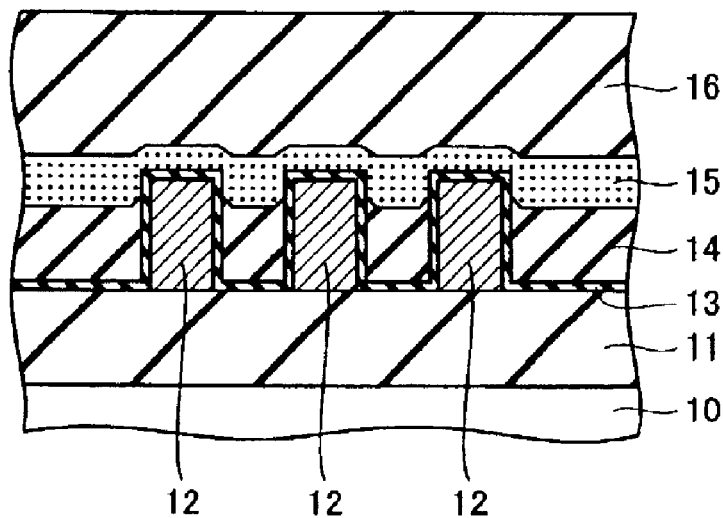

As shown in FIG. 5, the silicon oxide film 16 is formed on the upper surface of the modified SOG film 15 by plasma CVD with the thickness of about 1000 nm. The silicon oxide film 16 is formed under the same formation conditions as those for the silicon oxide film 13. The upper surface of the silicon oxide film 16 is polished by CMP, to be flattened.

Figure 6:
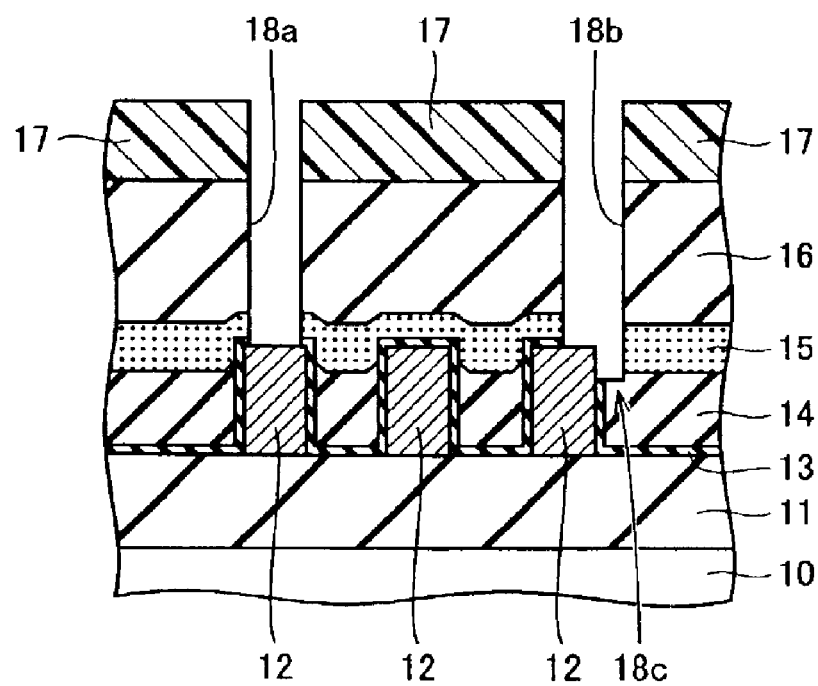

As shown in FIG. 6, a patterned resist film 17 is formed on a prescribed region of the silicon oxide film 16 by ordinary photolithography. This resist film 17 is employed as a mask for forming the contact holes 18a and 18b by general anisotropic etching. In this case, the contact hole 18a is properly registered with the lower interconnection 12 located under the same, while the contact hole 18b is improperly registered with respect to the lower interconnection 12 located under the same. Progress of an effect of refining the semiconductor device results in difficulty of proper registration, and hence the contact hole 18b may be improperly registered with the lower interconnection 12 located under the same, as shown in FIG. 6. The organic SOG film 14 is partially exposed on the bottom 18c of the improperly registered contact hole 18b. Also in this case, the plug 19b is preferably inhibited from increase of resistance or disconnection resulting from moisture discharged from the organic SOG film 14.

According to the first embodiment, therefore, oxygen plasmas are applied stepwise under the following two conditions in ashing for removing the resist film 17 for modifying the part of the organic SOG film 14 exposed on the bottom 18c of the contact hole 18b:

(First Stage: Low-Pressure Plasma Treatment)

Temperature: 0° C.

Pressure: 120 sccm

Oxygen Flow Rate: 120 sccm (Second Stage: High-Pressure Plasma Treatment)

Temperature: 270° C.

Pressure: 133 Pa

Oxygen Flow Rate: 4500 sccm

The unit sccm stands for the volume (cc) of a fluid flowing in one minute at a temperature of 0° C. under 1 atm.

The aforementioned first stage of low-pressure plasma application has an effect of forming the modified SOG region 21 by modifying the exposed surface of the organic SOG film 14 on the bottom 18c of the misregistered contact hole 18b. However, the resist film 17 cannot be sufficiently removed by the first stage of low-pressure plasma application. Therefore, the second stage of high-pressure plasma application is performed for completely removing the resist film 17.

Figure 8:
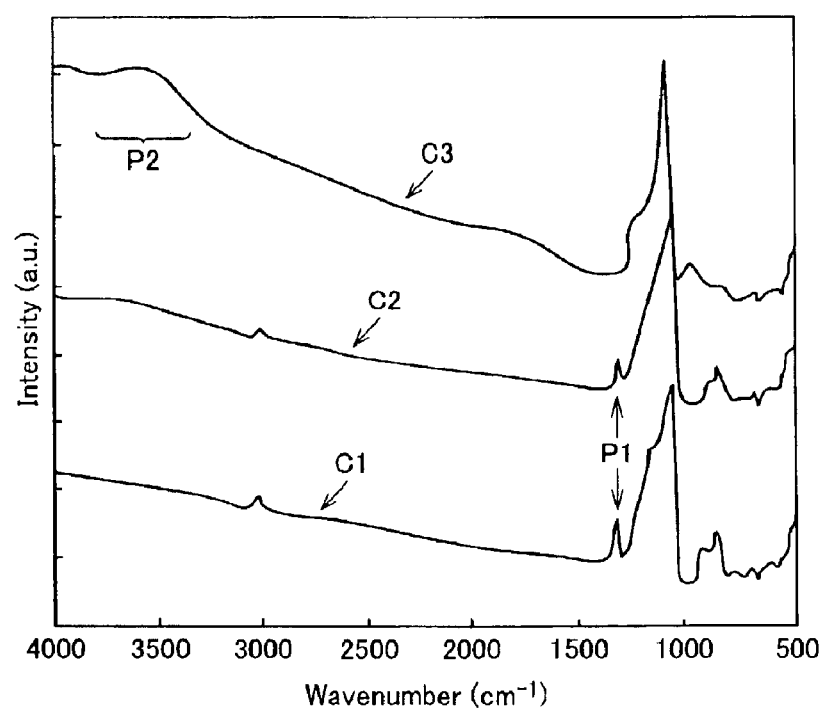
FIG. 8 is a characteristic diagram for illustrating an effect of the semiconductor device according to the first embodiment shown in FIG. 1.

Results of an experiment for supporting the effect of modifying the exposed surface of the organic SOG film 14 by the aforementioned two stages of oxygen plasma application are now described with reference to FIG. 8. FIG. 8 shows results of measurement of infrared absorption spectra on a film surface (C1) or an organic SOG film not yet subjected to plasma application, a film surface (C2) subjected to both of the aforementioned first stage of low-pressure plasma application and the aforementioned second stage of high-pressure plasma application and a film surface (C3) subjected to the aforementioned second stage of high-pressure plasma application. Referring to FIG. 8, the horizontal axis shows wavenumbers ($cm^{-1}$), and the vertical axis relatively shows infrared absorptivity.

Referring to FIG. 8, absorption peaks P1 of 1350 $cm^{-1}$ indicating presence of methyl groups (—$CH_3$) were confirmed on the spectra C1 and C2. Further, no absorption peaks P2 around 3800 $cm^{-1}$ to 3400 $cm^{-1}$ indicating presence of hydroxyl groups (—OH) were confirmed on the spectra C1 and C2. On the other hand, no absorption peak 1 indicating presence of methyl groups was confirmed but only an absorption peak P2 indicating presence of hydroxyl groups was confirmed on the spectrum C3 in the sample subjected to only the second stage of high-pressure plasma application.

It is conceivable from the aforementioned results that the dielectric constant is increased by absorbing moisture and the moisture absorbed in the SOG film 14 deteriorates electric characteristics when only the second stage of high-pressure plasma treatment is carried out (C3). In this case, the moisture absorbed in the SOG film 14 is discharged from the contact hole 18b before formation of the plug 19b, leading to a poisoned via phenomenon forming voids in the plug 19b. Thus, the quality of connection between the plug 19b and the lower interconnection 12 located under the same is deteriorated. When both of the first stage of low-pressure plasma application and the second stage of high-pressure plasma application are carried out (C2), organic components (methyl groups) remain in the SOG film 14 to inhibit the SOG film 14 from absorbing moisture. When the plug 19b is formed in the misregistered contact hole 18b, therefore, the SOG film 14 discharges no moisture so that the plug 19b can be inhibited from a poisoned via phenomenon forming voids therein. Consequently, the lower interconnection 12 and the plug 19b can be excellently connected with each other.

It is understood from the above that the first stage of low-pressure plasma application effectively inhibits the SOG film 14 from absorbing moisture when ashing the resist film 17. In other words, the first stage of low-pressure plasma application has an effect of modifying the exposed surface of the organic SOG film 14.

The inventors have experimentally confirmed that the effect of modifying the exposed surface of the organic SOG film 14 by the first stage of low-pressure oxygen plasma application is attained by setting the pressure of the plasma to not more than about 2 Pa.

The modified SOG region 21 is formed on the surface portion of the organic SOG film 14 exposed on the bottom 18c of the contact hole 18b improperly registered with the lower interconnection 12 due to the aforementioned two stages of plasma application, whereby the plug 19b and the organic SOG film 14 are not directly in contact with each other.

Figure 7:
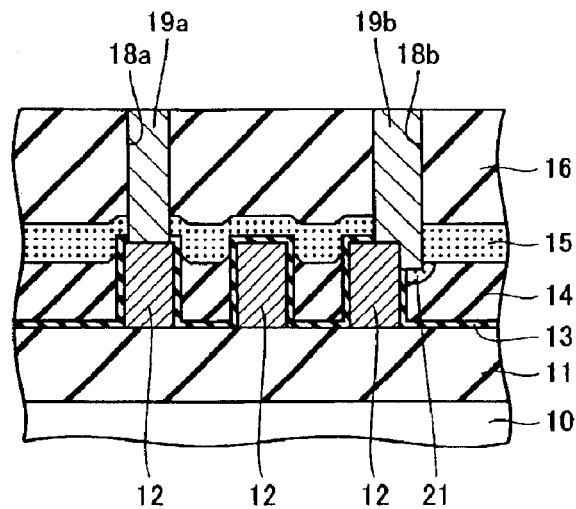

After the aforementioned ashing of the resist film 17, the plugs 19a and 19b are formed in the contact holes 18a and 18b respectively. More specifically, a film of titanium (Ti) is formed by sputtering, followed by formation of a film of titanium nitride (TiN) by CVD and deposition of a film of tungsten (W) by blanket tungsten CVD. The surface of this three-layer film is polished by CMP to expose the upper surface of the silicon oxide film 16. Thus, the plugs 19a and 19b connected with the lower interconnections 12 are formed as shown in FIG. 7.

Finally, a metal film (not shown) is deposited on the upper surface of the silicon oxide film 16 as well as the upper surfaces of the plugs 19a and 19b and thereafter patterned by ordinary photolithography and anisotropic etching, thereby forming the upper interconnections 27 as shown in FIG. 1. Thus, the semiconductor device according to the first embodiment is completed.

In the process of fabricating the semiconductor device according to the first embodiment, as hereinabove described, ions of boron widely employed as the impurity ion-implanted into an insulator film are ion-implanted into the organic SOG film 14a, whereby the impurity can be easily and controllably ion-implanted into the organic SOG film 14a. Thus, the organic SOG film 14a can be easily and controllably modified.

(Second Embodiment)

Figure 9:
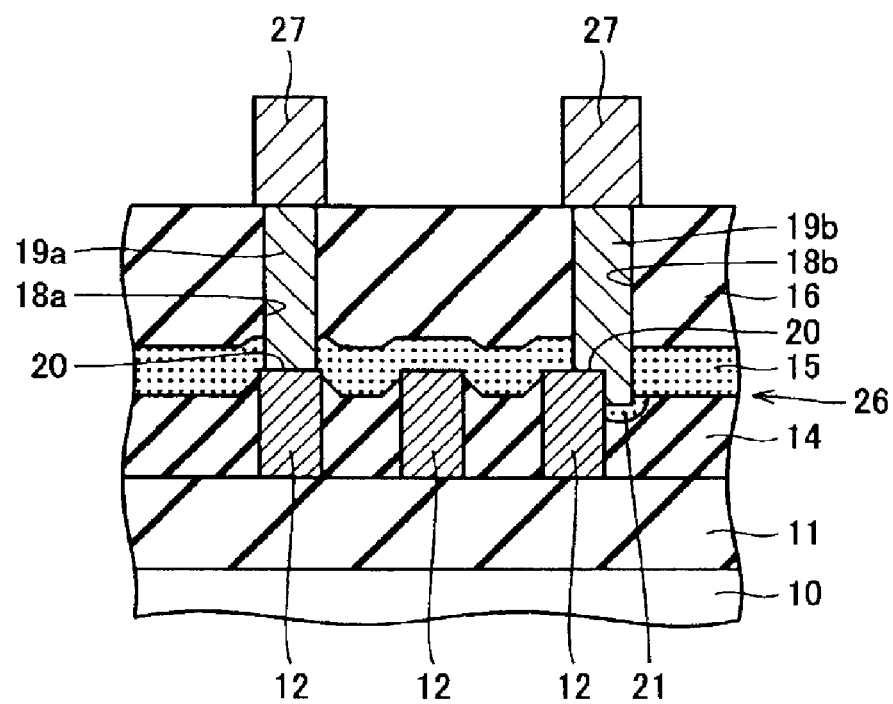
FIG. 9 is a sectional view showing a semiconductor device according to a second embodiment of the present invention.
Figure 10:
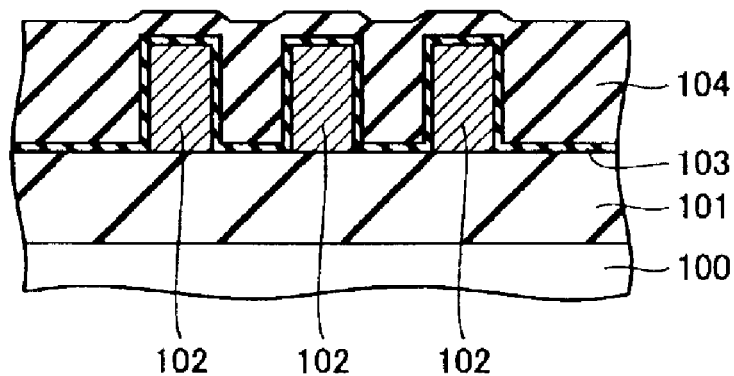
FIGS. 10 to 12 are sectional views for illustrating a process of fabricating a conventional semiconductor device employing an organic SOG film as an insulator film between interconnection layers.
Figure 11:
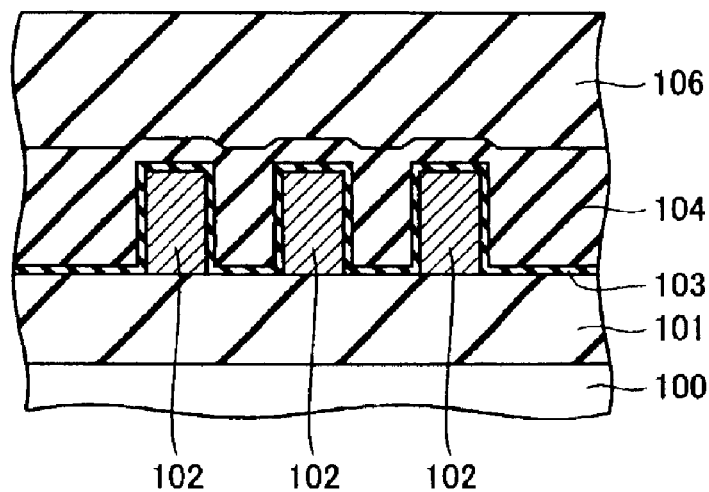
Figure 12:
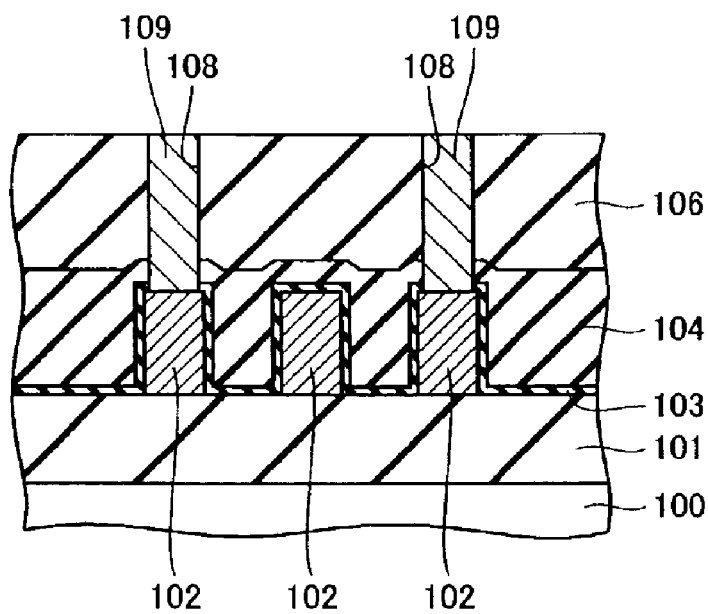
Figure 13:
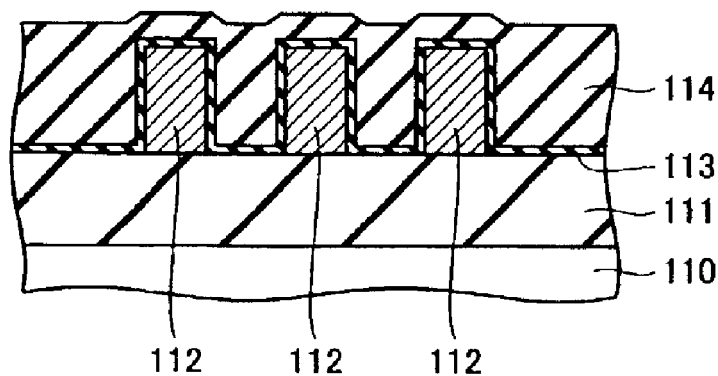
FIGS. 13 to 16 are sectional views for illustrating a process of fabricating a conventional semiconductor device employing a modified organic SOG film as an insulator film between interconnection layers.
Figure 14:
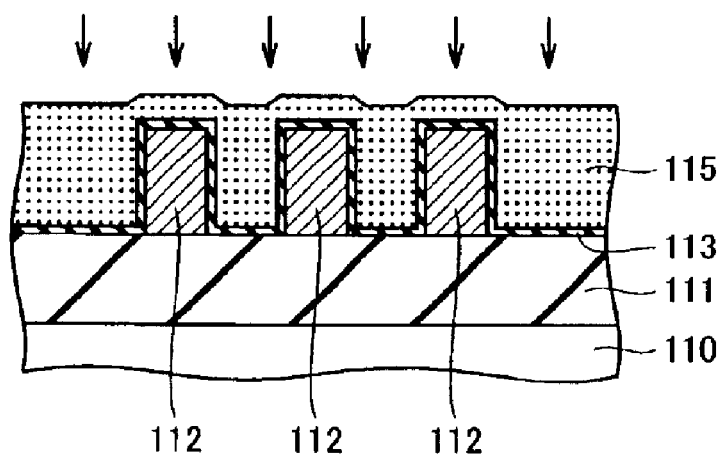
Figure 15:
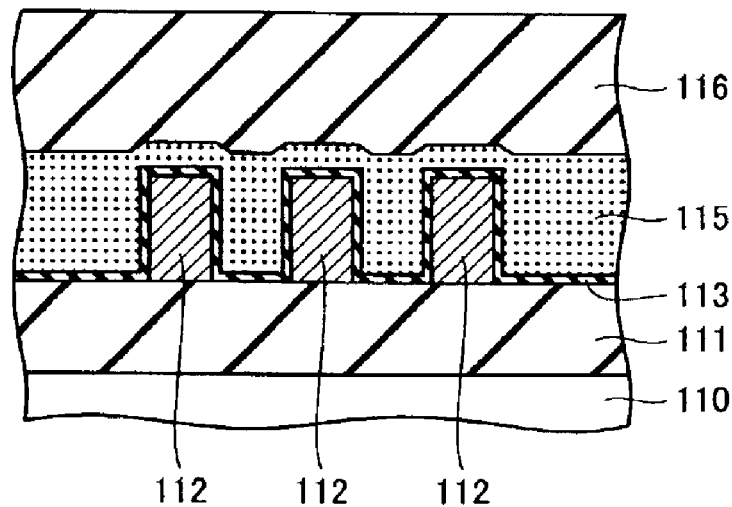
Figure 16:
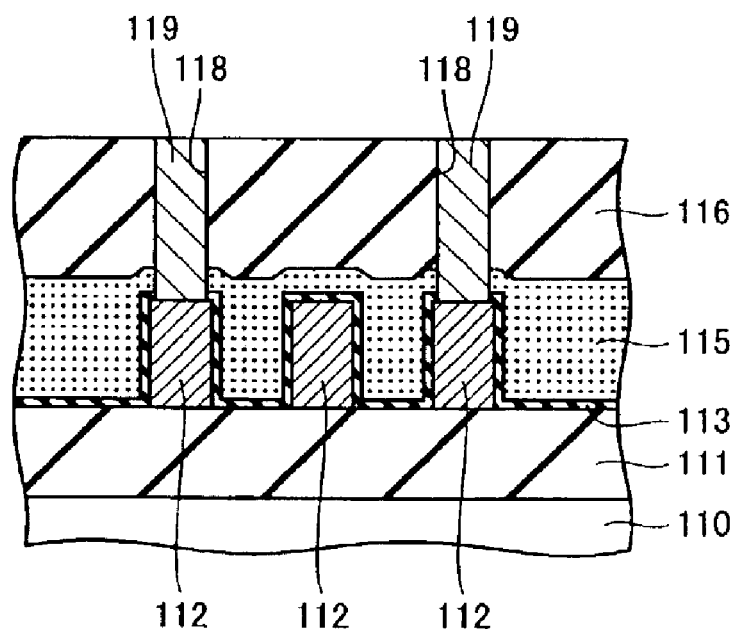

FIG. 9 is a sectional view showing a semiconductor device according to a second embodiment of the present invention. Referring to FIG. 9, the semiconductor device according to the second embodiment has a structure similar to that of the semiconductor device according to the first embodiment shown in FIG. 1, except that the same has no silicon oxide film 13. The remaining structure of the semiconductor device according to the second embodiment is similar to that of the semiconductor device according to the first embodiment.

According to the second embodiment, no silicon oxide film 13 having a large dielectric constant is present between adjacent lower interconnections 12, whereby the capacitance between the adjacent lower interconnections 12 can be further reduced as compared with the structure of the semiconductor device according to the first embodiment shown in FIG. 1.

The remaining effect of the semiconductor device according to the second embodiment is similar to that of the semiconductor device according to the first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while boron ions are implanted with acceleration energy of about 80 keV for selectively modifying the upper layer part of the organic SOG film 14a in the aforementioned first embodiment, the present invention is not restricted to this but the ion implantation may alternatively be performed under other implantation conditions. In other words, the ion implantation conditions are preferably properly varied with the thickness of the lower interconnections 12, the open area ratio (density of the interconnection areas)

of the lower interconnections 12, the thickness of the organic SOG film 14a or the like. Thus, the upper surfaces 20 of the lower interconnections 12 can be reliably rendered adjacent to the modified SOG film 15.

While boron is employed as the impurity ion-implanted for modifying the organic SOG film 14a in the aforementioned first embodiment, the present invention is not restricted to this but ions of argon or nitrogen may alternatively be employed.

Further alternatively, the organic SOG film 14a can be modified by implanting any of the following ions:

(i) Ions of inert gas other than argon may be employed. In other words, ions of helium, neon, krypton, xenon or radon can be employed. Such inert gas is unreactive with the organic SOG film 14a and hence absolutely no bad influence is exerted on the film characteristics by the ion implantation.

(ii) Ions of a simple element belonging to the group 3b, 4b, 5b, 6b or 7b of the periodic table other than boron and nitrogen or ions of a compound of such an element may be employed. In particular, ions of a simple element such as oxygen, aluminum, sulfur, chlorine, gallium, germanium, arsenic, serene, bromine, antimony, iodine, indium, tin, tellurium, lead or bismuth or a compound thereof can be employed.

(iii) Ions of a simple element belonging to the group 4a or 5a of the periodic table or a compound thereof can also be employed. In particular, ions of a simple element such as titanium, vanadium, niobium, hafnium or tantalum or a compound thereof can be employed.

(iv) Any combination of the ions of the aforementioned elements or compounds can also be employed. In this case, a superior effect can be attained by a synergetic effect of the ions of the aforementioned elements or compounds.

(v) In addition, atoms, molecules or other particles implanted with kinetic energy capable of modifying the organic SOG film 14a can also be employed in addition to the ions of the aforementioned elements or compounds.

While the silicon oxide films 13 and 16 are formed by plasma CVD in the aforementioned first embodiment, the present invention is not restricted to this but the silicon oxide films 13 and 16 may alternatively be formed by another method. For example, the silicon oxide films 13 and 16 may be formed by atmospheric pressure CVD, low-pressure CVD, ECR (electron cyclotron resonance) plasma CVD, photoexcitation CVD, TEOS-CVD or PVD, for example. When the atmospheric pressure CVD is employed, reactive gas is preferably prepared from monosilane and oxygen ($SiH_4+O_2$) and the film forming temperature is preferably set to not more than about 400° C. When the low-pressure CVD is employed, the reaction gas is preferably prepared from monosilane and nitrous oxide ($SiH_4+N_2O$) and the film forming temperature is preferably set to not more than about 900° C.

While the silicon oxide films 13 and 16 are formed in the aforementioned first embodiment, the present invention is not restricted to this but the silicon oxide films 13 and 16 may alternatively be replaced with other insulator films. For example, insulator films having high mechanical strength in addition to a property of blocking moisture or hydroxyl groups may be employed. Such insulator films may be prepared from silicon nitride, silicate glass or BPSG (borophosphosilicate glass), for example. In this case, the insulator films may be formed by any method such as CVD or PVD.

While the interlayer dielectric film 11 is employed as the underlayer for the lower interconnections 12 in the aforementioned first embodiment, the present invention is not restricted to this but the surface of an arbitrary insulating film formed on the semiconductor substrate 10 can be employed as the underlayer for the lower interconnections 12. For example, the present invention may be applied to an insulator film for insulating gate electrode interconnections formed on an underlayer of a gate insulator film in a structure including elements such as MOS transistors formed on the surface of a semiconductor substrate.

While the organic SOG film 14 is employed as the insulator film insulating the lower interconnections 12 from each other in the aforementioned first embodiment, the present invention is not restricted to this but is also applicable to a case of employing another insulator film such as a polyimide film, an organic SOG film or an organic polymer film, for example.

What is claimed is:

1. A semiconductor device comprising:

a plurality of first interconnection layers formed on a semiconductor substrate at a prescribed interval;

a first insular film, formed to fill up the clearance between said plurality of first interconnection layers, having an opening reaching said first interconnection layers; and a conductive plug charged in said opening of said first insulator film and formed to be in contact with said first interconnection layers; wherein an impurity is selectively introduced into a first region of said first insulator film in the vicinity of contact surfaces between said first interconnection layers and said conductive plug thereby selectively modifying said first region of said first region of said first insulator film, wherein said opening of said first insulator film is formed to expose the upper surfaces and the side surfaces of said first interconnection layers as well as a region of said first insulator film located under modified said first region, and a modified region is formed on said region of said first insulator film located under said first region exposed in said opening.

2. The semiconductor device according to claim 1, wherein said conductive plug is formed to be in contact with the upper surfaces of said first interconnection layers, said first insulator film includes said first region modified in the vicinity of said contact surfaces between said first interconnection layers and said conductive plug and an unmodified second region other than said first region, and the boundary between said first region and said second region of said first insulator film is located downward beyond the upper surfaces of said first interconnection layers.

3. The semiconductor device according to claim 1, wherein said first insulator is formed to be directly in contact with said first interconnection layers.

4. The semiconductor device according to claim 1, further comprising a second insulator film, interposed between said first insulator film and said first interconnection layers, superior to said first insulator film in adhesiveness.

5. The semiconductor device according to claim 1, wherein
said impurity selectively introduced into said first insulator film is boron.

6. The semiconductor device according to claim 1, wherein said first insulator film includes an organic SOG film.

7. The semiconductor device according to claim 1, wherein the upper surface of said first insulator film is substantially flattened.

8. The semiconductor device according to claim 1, wherein
said first interconnection layers are formed to be in contact with the upper surface of an interlayer dielectric film formed on said semiconductor substrate.

9. The semiconductor device according to claim 1, further comprising a second interconnection layer formed to be in contact with the upper surface of said conductive plug.

* * * * *